United States Patent [19]

Weber

[11] Patent Number: 5,077,555
[45] Date of Patent: Dec. 31, 1991

[54] INPUT SIGNAL CONDITIONING FOR MICROCOMPUTER

[75] Inventor: Charles F. Weber, South Lyon, Mich.

[73] Assignee: Ford Motor Company, Dearborn, Mich.

[21] Appl. No.: 280,907

[22] Filed: Dec. 7, 1988

[51] Int. Cl.[5] .......................... H03M 1/12; H03K 5/13
[52] U.S. Cl. ..................................... 341/155; 307/592; 307/363
[58] Field of Search .................... 307/10 R, 106, 318, 307/10.1, 296.5, 362, 363, 592; 341/138, 133, 124, 155; 328/74

[56] References Cited

U.S. PATENT DOCUMENTS

| | | | |
|---|---|---|---|
| 4,338,665 | 7/1982 | Aono et al. ........................... | 341/124 |
| 4,527,248 | 7/1985 | Takase et al. . | |
| 4,536,667 | 8/1985 | Masuda ................................ | 307/592 |
| 4,555,789 | 11/1985 | Hogge, Jr. ........................... | 307/363 |
| 4,614,880 | 9/1986 | Go et al. .............................. | 307/592 |
| 4,642,484 | 2/1987 | Skovmand et al. . | |
| 4,668,875 | 5/1987 | Miyazaki et al. . | |
| 4,685,023 | 8/1987 | Heaston .............................. | 361/92 |
| 4,701,639 | 10/1987 | Stanojevic .......................... | 307/106 |
| 4,902,970 | 2/1990 | Suquet ................................. | 341/155 |

Primary Examiner—William M. Shoop, Jr.
Assistant Examiner—Helen Kim
Attorney, Agent, or Firm—Allan J. Lippa; Peter Abolins

[57] ABSTRACT

A circuit with hysteresis for converting an analog signal into a logic signal. In response to the state of the feedback signal from a microcomputer, a signal proportional to the analog signal is either intensified for providing a lower threshold value or diminished for providing an upper threshold value. By recognizing the intensified and diminished signals with respect to a predetermined value, the analog signal is converted to a two-state signal.

18 Claims, 5 Drawing Sheets

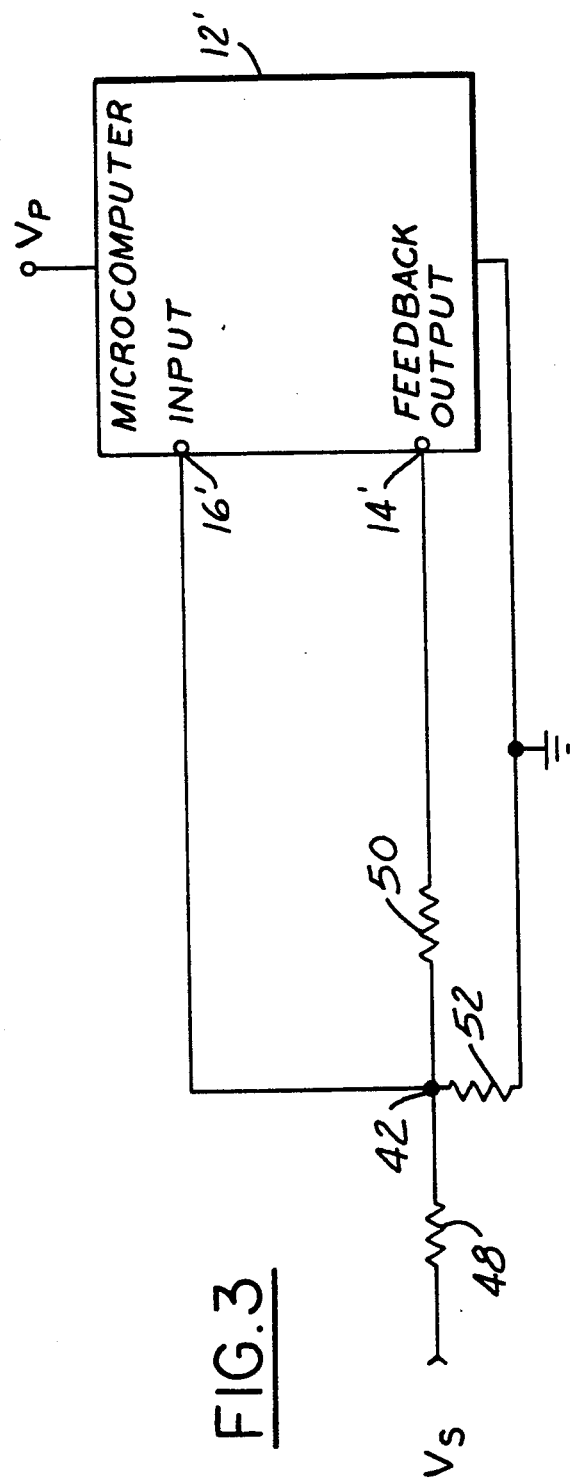

INPUT SIGNAL CONDITIONING FOR MICROCOMPUTER

BACKGROUND OF THE INVENTION

The field of the invention relates to signal detection with hysteresis.

Conversion of an analog signal into a two-state signal is necessary before digital processing. For example, in automobile applications, a sensor coupled to an automobile's drivetrain provides an analog signal having a frequency related to vehicular speed. After conversion to a digital signal, a microcomputer detects the time interval of each cycle and computes vehicular speed by conventional algorithms. A problem encountered is that the sensor signal has a high degree of noise due to the physical environment of the sensor and appropriate connecting cables. This noise may be erroneously detected as a signal transition thereby adversely affecting any resulting computations.

It is known to use a low pass filter between the sensor signal and microcomputer to improve signal to noise ratio as disclosed in U.S. Pat. No. 4,668,875 issued to Miyazaki et al on 26 May 1987. However, dependent upon the particular application, a low pass filter may not provide sufficient signal to noise ratio over a wide range of signal frequencies.

An approach to improve signal to noise ratio is to use multiple transistors configured as a differential amplifier for providing a comparator with hysteresis about an external reference signal. When the input signal exceeds the reference signal by the hysteresis value, a logic "1" output is provided. Conversely, when the input signal falls below the reference signal by the hysteresis value, a logic "0" output is provided. One disadvantage of this approach is that noise components may cause false triggering at either the upper or lower threshold values. False triggering at the threshold values may be reduced by connecting a latching circuit to the differential amplifier as disclosed in U.S. Pat. No. 4,642,484 issued to Skovmand et al on 10 Feb. 1987.

A disadvantage of the above approaches is the circuit complexity of using comparators or differential amplifiers and latching circuitry. In applications such as automotive applications, where the size and resulting interconnections of electrical circuitry are constrained by a host module, these disadvantages may be prohibitive.

SUMMARY OF THE INVENTION

It is an object of the present invention to provide a circuit for conditioning an input signal to a microcomputer utilizing hysteresis comparison with minimal components.

The above problems and disadvantages are overcome, and object achieved, by providing a circuit for translating a signal into a two-state input signal for use by a microcomputer. In one particular aspect of the invention, the circuit comprises: summing means for adding electrical energy to the signal in response to a first feedback state of a feedback control signal to generate an intensified signal and for subtracting electrical energy from the signal in response to a second feedback state of the feedback control signal to generate a diminished signal; and controller means coupled to the summing means for recognizing a first input state of the signal when the diminished signal exceeds a predetermined value and for recognizing a second input state of the signal when the intensified signal falls below the predetermined value, the controller means comprising means for generating the feedback control signal having the first feedback state when the diminished signal exceeds the predetermined value and having the second feedback state when the intensified signal falls below the predetermined value.

By subtracting electrical energy from the signal to generate a diminished signal, a relatively large positive excursion in the signal is required before a logic "1" is recognized. Similarly, by adding electrical power to generate an intensified signal after a logic "1" is recognized, a relatively large negative excursion in the signal is required before a logic "0" is recognized. The converse is true after a logic "0" is recognized. An advantage is thereby obtained of having a hysteresis comparator without the need for differential amplifiers or multiple comparators by utilizing simple feedback from a controller or microcomputer as described herein.

In another aspect of the invention, the circuit comprises: summing means for adding electrical energy to the signal in response to a first feedback state of a feedback control signal to generate an intensified signal and for subtracting electrical energy from the signal in response to a second feedback state of the feedback control signal to generate a diminished signal; switching means responsive to the summing means for providing a negative edge interrupt signal when the diminished signal exceeds a predetermined value and for providing a positive edge interrupt signal when the intensified signal falls below the predetermined value; and microcomputer means responsive to the switching means for generating the feedback control signal having the first feedback state in response to the negative edge interrupt signal and having the second feedback state in response to the positive edge interrupt signal. Preferably, after recognizing an interrupt transition, the microcomputer disregards further changes in the interrupt signals until after generating the feedback output. An additional advantage is thereby obtained of providing noise immunity at the threshold levels without the need for additional circuitry such as latching circuitry and the like.

BRIEF DESCRIPTION OF THE DRAWINGS

The objects and advantage described herein will be more fully understood by reading the Description of the Preferred Embodiment with reference to the drawings wherein:

FIG. 3 is an electrical schematic of another embodiment in which the invention is used to advantage;

DESCRIPTION OF PREFERRED EMBODIMENT

Figure 1:
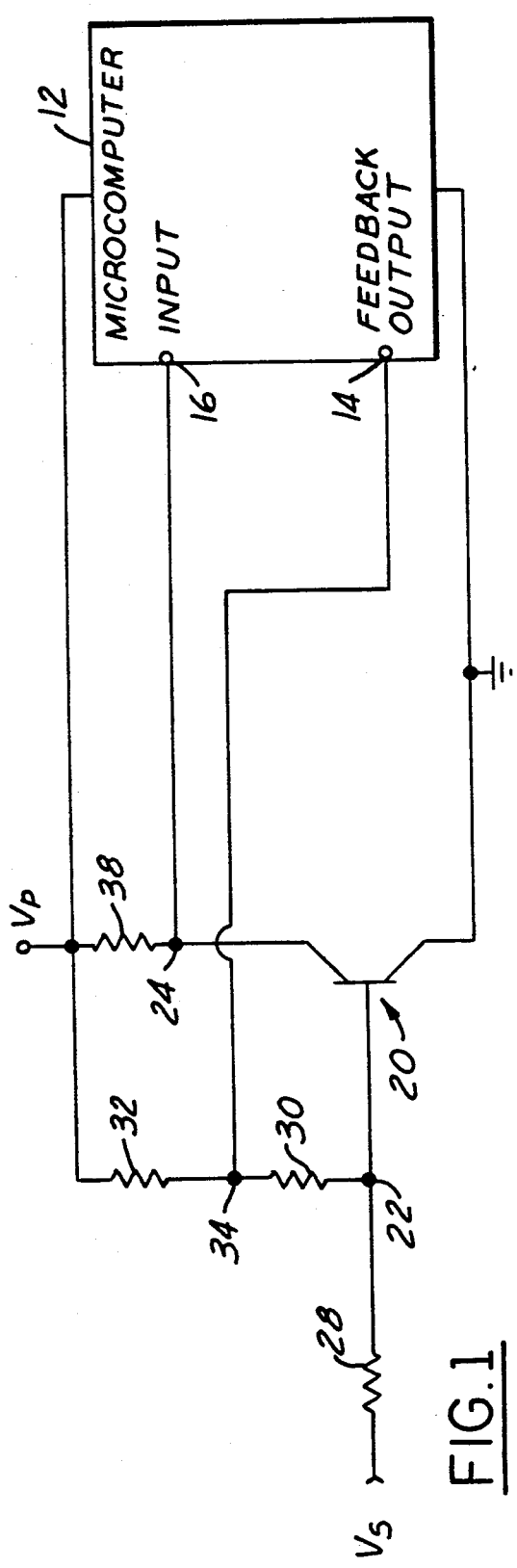
FIG. 1 is an electrical schematic of an embodiment in which the invention is used to advantage.

Referring first to FIG. 1, a controller such as microcomputer 12, an off-the-self device sold by Motorola as Part No. MC68HC05 in this example, is shown coupled to signal Vs through circuitry described in greater detail hereinafter. For this particular example, a speed sensor (not shown) coupled to the engine drive train (not shown) generates analog signal Vs having a frequency related to vehicular speed. After the signal conditioning described below, microcomputer 12 calculates vehicular speed in a conventional manner by first computing elapsed time between two corresponding edge transitions of signal Vs.

Microcomputer 12 is shown connected to a conventional power source ($V_p$) and a signal return (shown as ground). Feedback output 14 provides a two-state output responsive to input 16. For the example shown herein, microcomputer 12 recognizes a logic "1" state when the voltage at input 16 is above one-half $V_p$ and recognizes a logic "0" state when the input voltage is below one-half $V_p$. Feedback output 14 is set near ground potential when input 16 is at a logic "1" and set at a high impedance, essentially open, when input 16 is at a logic "0".

Switching transistor 20, a bipolar NPN transistor in this example, is shown having a control or base electrode connected to node 22, an output or collector electrode connected to node 24, and another output or emitter electrode connected to signal ground. Node 22 is also shown connected to signal Vs via series resistor 28. Resistors 30 and 32 are shown connected in series through node 34. The series interconnection of resistors 30 and 32 is connected between node 22 and $V_p$. Resistor 38 is shown connected between node 24 and $V_p$.

The operation of the circuitry shown in FIG. 1, including microcomputer 12, is now described with reference to the associated waveforms shown in FIGS. 2A–2D. Initial conditions are shown before time $t_0$ when input 16 is recognized as a logic "1" and feedback output 14 of microcomputer 12 is at a logic "0". During this time, node 34 is essentially at ground potential such that a portion of the electrical energy or current applied to node 22 from signal Vs flows through resistor 30 to ground via feedback output 14. Thus, the electrical signal at node 22, as shown in FIG. 2B, is both proportional to signal Vs and diminished by the current flowing through resistor 30.

Figure 2A:
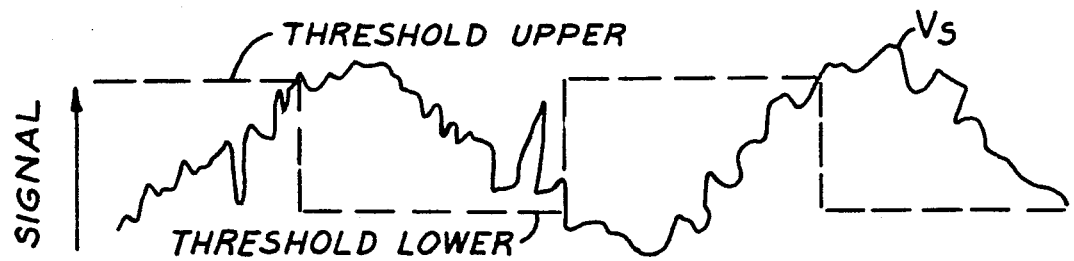
FIGS. 2A-2D represent various electrical waveforms associated with the embodiment shown in FIG. 1.
Figure 2B:
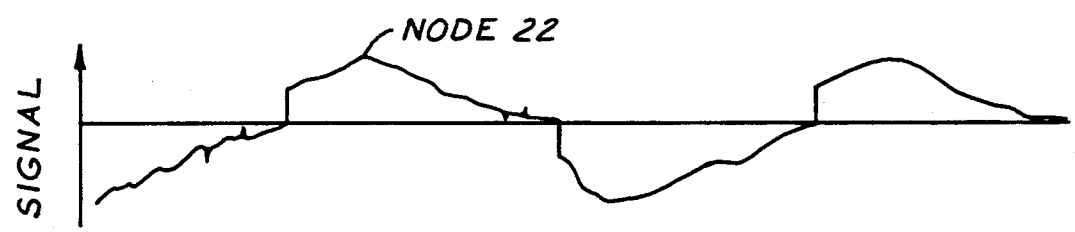
Figure 2C:
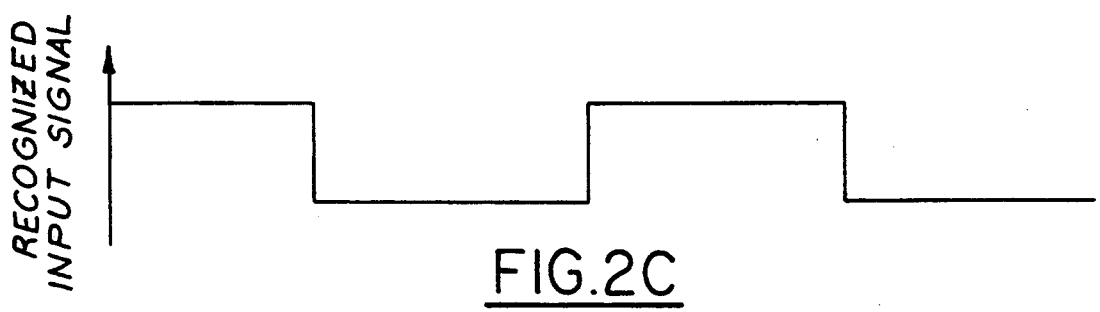

Referring to FIGS. 2A and 2B, the diminished signal at node 22 increases in response to an increasing signal Vs thereby turning on transistor 20 at time $t_0$. As transistor 20 turns on in response to base current flowing from node 22, the voltage at node 24 is pulled down through the dynamic impedance of transistor 20 towards ground. As the voltage at input 16 falls below $\frac{1}{2} V_p$, microcomputer 12 recognizes it as a logic "0" (FIG. 2C). In response, microcomputer 12 switches feedback output 14 to a high impedance. Resistors 30 and 34 are thereby connected directly in series between $V_p$ and node 22. Accordingly, the electrical signal present at node 22 is now intensified by current flowing through resistors 30 and 34. This intensified signal is shown in FIG. 2B between times $t_0$ and $t_1$. Stated another way, the signal at node 22, which is proportional to signal Vs, is abruptly offset in the positive direction in response to feedback output 14 switching to a high impedance state after time $t_0$.

Figure 2D:
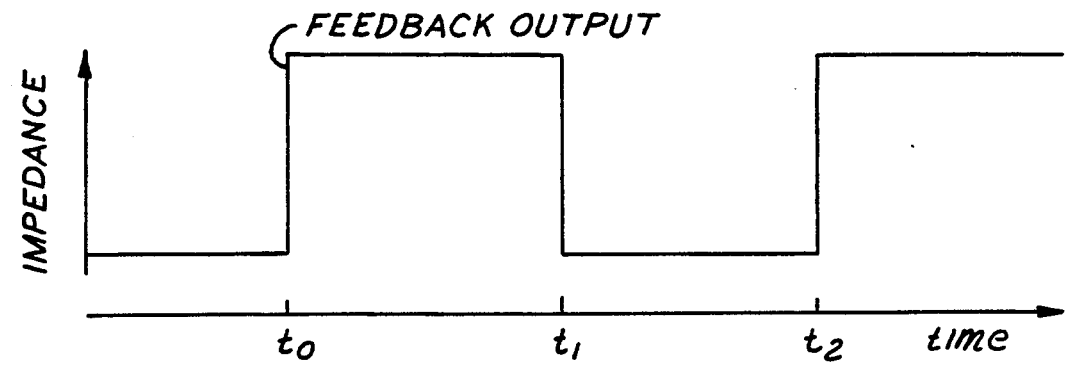
Figure 4A:
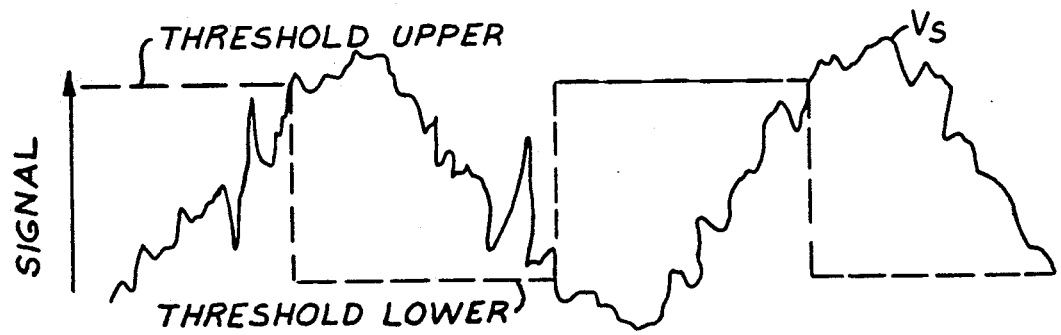
FIGS. 4A-4D represent various electrical waveforms associated with the embodiment shown in FIG. 3.
Figure 4B:
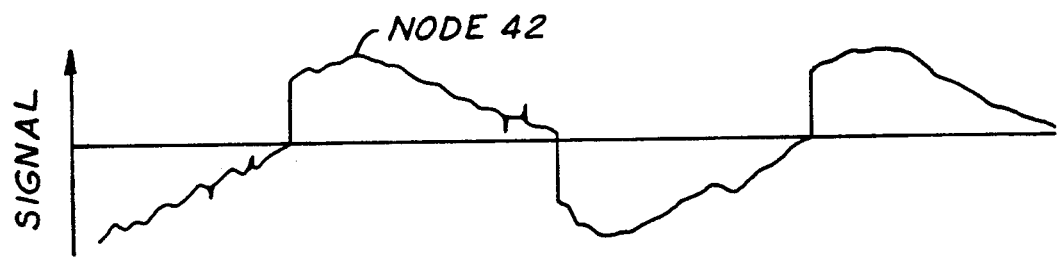
Figure 4C:
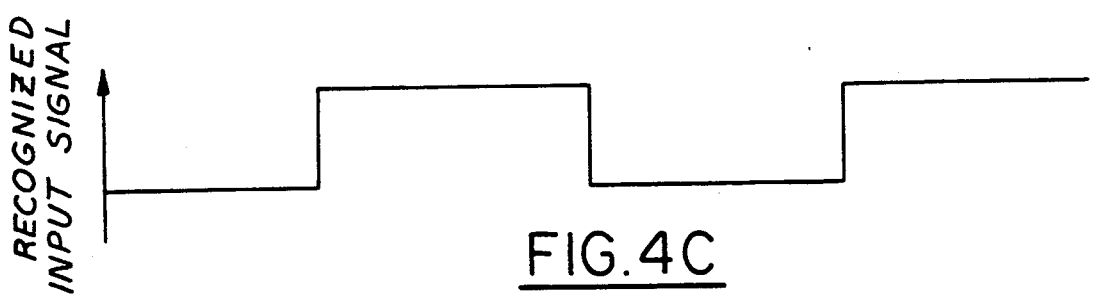
Figure 4D:
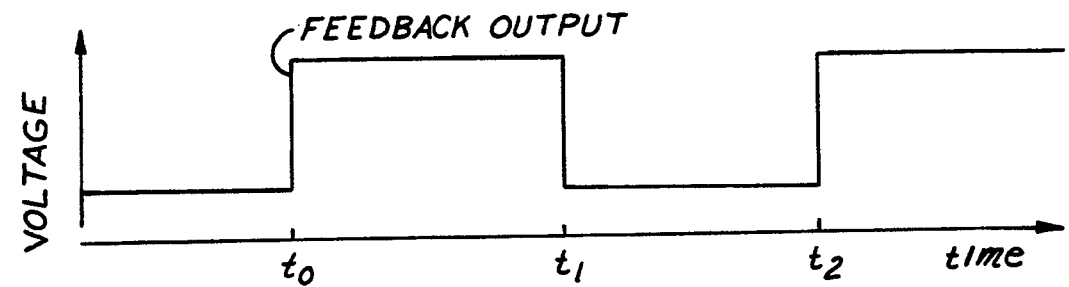

As signal Vs decreases, the intensified signal at node 22 also decreases until transistor 20 turns off at time $t_1$. The voltage at node 24 then rises towards $V_p$ resulting in recognition by microcomputer 12 of a logic "1" at input 14. In response, microcomputer 12 switches feedback output 14 to the logic "0" state as shown in FIG. 2D.

When feedback output 14 is switched to the logic "0" state, resistor 34 is again coupled between node 22 and ground potential thereby diminishing the electrical signal at node 22. Stated another way, the signal at node 22 is abruptly offset in the negative direction as shown at time $t_1$ in FIG. 2B. Operation then continues until time $t_2$ in a manner similar to that described previously with particular reference to the time interval preceding $t_0$.

It is noted that the operation of diminishing and enhancing the signal at node 22 essentially provides an upper and lower threshold, respectively, to signal Vs. While the signal at node 22 is intensified, a decrease in Vs to the lower threshold value shown in FIG. 2A is required before transistor 20 turns off and a logic "1" is recognized by microcomputer 12. Similarly, while the signal at node 22 is diminished, an increase in Vs to the upper threshold value shown in FIG. 2A is required before transistor 20 turns on and microcomputer 12 recognizes a logic "0".

It is also noted that considerable noise immunity is provided to the switching operation by both enhancing and diminishing the signal at node 22. More specifically, when the signal at node 22 is offset in the positive direction, any noise variation in signal Vs coupled to node 22 must at least overcome the positive offset before triggering transistor 20. The same is true with respect to a negative offset of the signal at node 22.

An alternate embodiment is now described with reference to FIG. 3 wherein like numerals refer to like parts shown in FIG. 1, and also with reference to the associated electrical waveforms shown in FIGS. 4A–4D. In this particular example, microcomputer 12' provides a logic "1" or positive voltage of approximately $V_p$ when input 16' is recognized as a logic "1", and provides a logic "0", essentially ground potential, when a logic "0" is recognized at input 16'. As in the embodiment illustrated in FIG. 1, a logic "1" is recognized when input 16' exceeds one-half $V_p$, and a logic "0" is recognized below one-half $V_p$. Input 16' of microcomputer 12' is shown connected to node 42. Resistor 48 is shown connected between node 42 and signal Vs; resistor 52 is shown connected between node 42 and ground potential; and resistor 50 is shown connected between node 42 and feedback output 14'.

Referring to the time interval before $t_0$ in FIGS. 4A–4D, feedback output 14' is at a logic "0" thereby connecting resistors 50 and 52 in parallel to ground. Accordingly, the electrical signal at node 22 is diminished. When signal Vs increases sufficiently for the diminished signal to be recognized as a logic "1" at input 16' (time $t_0$ in FIG. 4A through 4D), microcomputer 12' switches feedback output 14' to a logic "1" state. Resistor 50 is thereby coupled between node 42 and approximately $V_p$ while only resistor 52 remains coupled between node 42 and ground. Thus, as compared to the time interval before $t_0$, additional current flows into node 42 (through resistor 50) while less current flows out of node 42 (through resistor 52 towards ground). The signal at node 42 is accordingly intensified, or offset in a positive direction after time $t_0$. With the signal being intensified, Vs decreases to the lower threshold value (FIG. 4A) before the signal at node 42 falls sufficiently to be recognized as a logic "1" by microcomputer 12' (at time $t_1$). Thereafter, the operation proceeds in a similar manner as that described before time $t_0$.

It is noted that the amount of positive and negative offset of the signal at node 42 is related to the respective lower and upper threshold limits of signal Vs. Those skilled in the art will recognize that these limits are selectable by appropriate selection of resistors 48, 50, and 52. For example, when these resistive values are equal, the upper threshold value is equal to three-halves $V_p$, and the lower threshold value is equal to one-half $V_p$.

Figure 5:
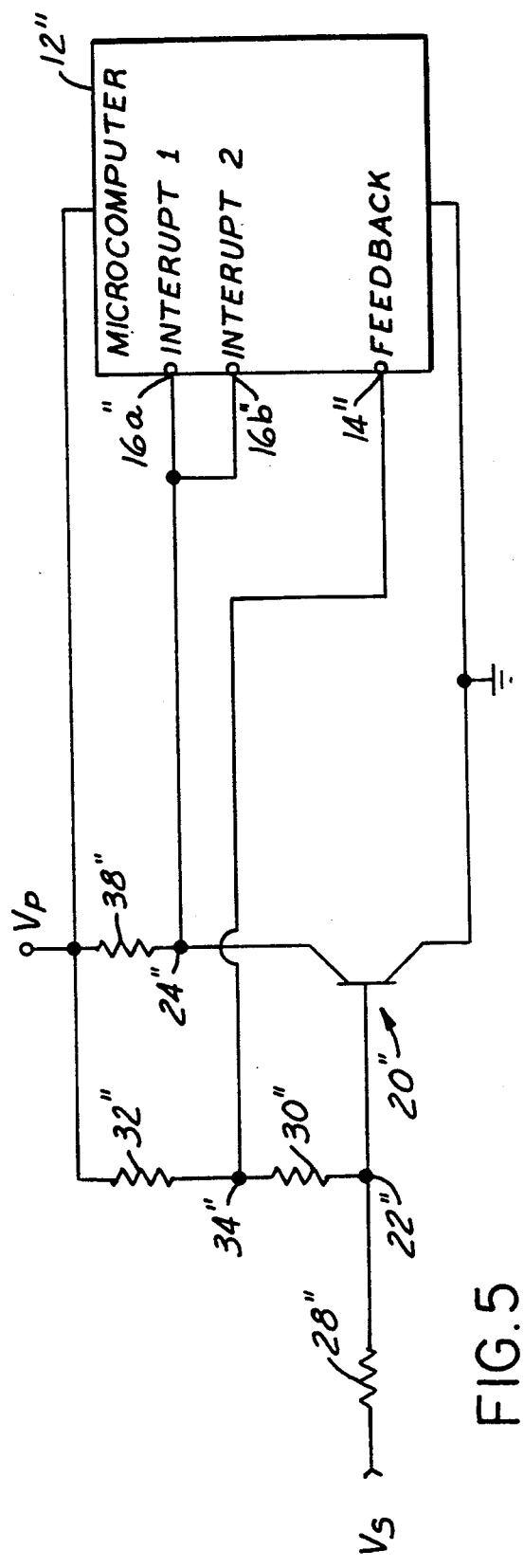
FIG. 5 is an electrical schematic of still another embodiment in which the invention is used to advantage.

Still another alternate embodiment is presented herein with reference to FIG. 5 wherein like numerals refer to like parts shown in the embodiment of FIG. 1. Microcomputer 12" is shown having conventional positive edge interrupt line 16a" and negative edge interrupt line 16b" whereas the embodiment illustrating microcomputer 12 in FIG. 1 showed a single input line 16. The operation of microcomputer 12" is similar to that described previously herein with reference FIGS. 1 and 2 except that microcomputer 12" is now responsive to edge transitions on the interrupt lines rather than the recognition of a logic state.

Figure 6:
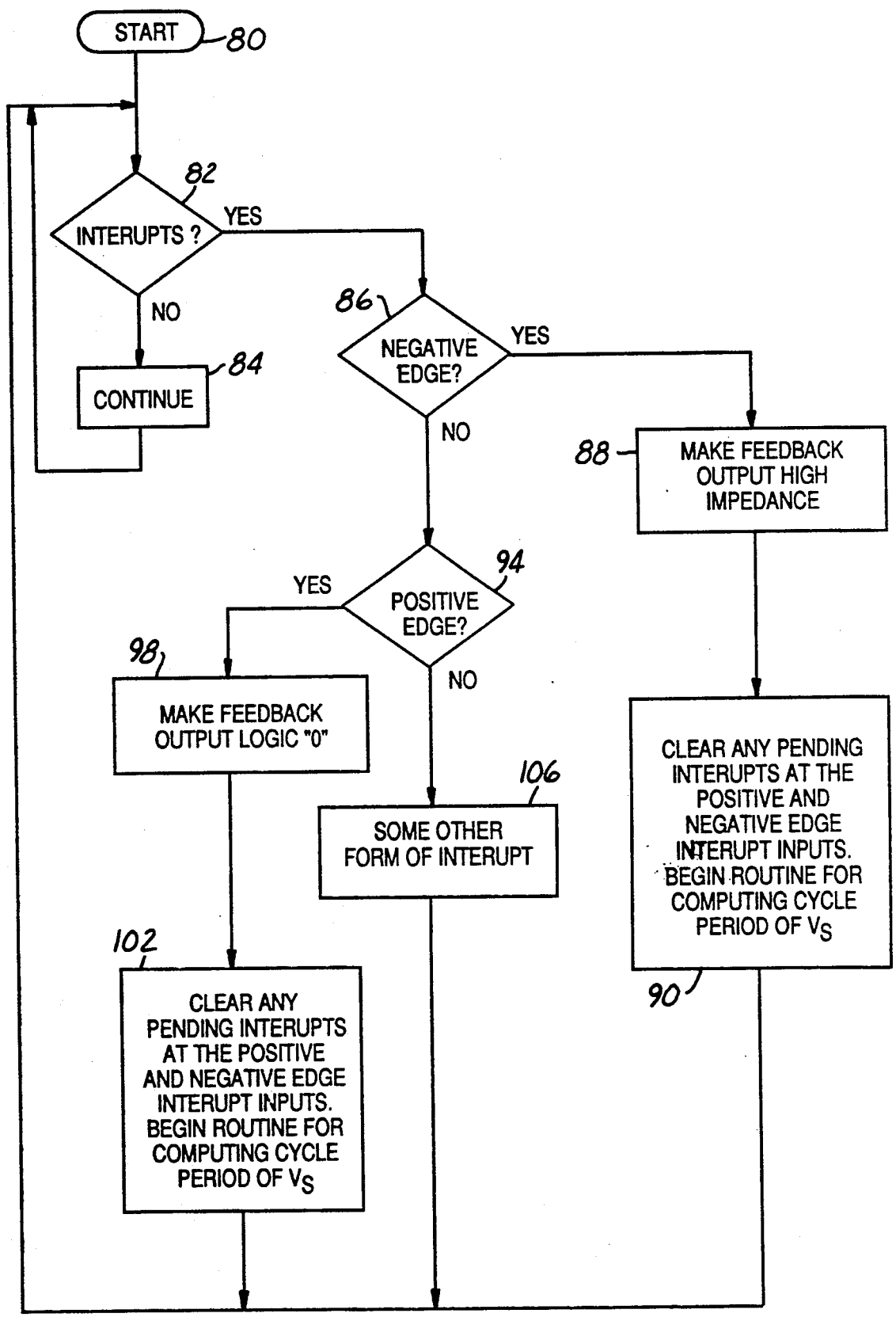
FIG. 6 represents various process steps associated with the embodiment shown in FIG. 5.

In operation, when Vs crosses the upper threshold value shown in FIG. 2A, transistor 20" turns on providing a negative edge on interrupt line 16b". Microcomputer 12" then sequentially performs the following steps described with reference to FIG. 6. Interrupts, whether positive or negative, are detected and stored in step 82. A determination is then made that a negative edge interrupt occurred in step 86 and feedback output 14" is subsequently set at a high impedance in step 88. Any subsequent interrupts which may have occurred between execution of steps 86 and 88 are cleared in step 90. These subsequent interrupts may have been due to noise before feedback output 14" was switched. Thus, additional noise immunity is provided in response to the interrupt inputs. Microcomputer 12" then performs the desired processing by computing the cycle period of signal Vs.

In a similar manner, when Vs crosses the lower threshold shown in FIG. 2A, transistor 20" turns off resulting in a positive edge at interrupt line 16a". Microcomputer 12" then determines that a positive edge interrupt occurred in steps 86 and 90. In response, feedback output 14" is set to a logic "0" state. Any subsequent interrupts which may have occurred before feedback output 14" was set to a logic "0" state are cleared in step 102. The desired processing of conditioned signal Vs is then performed as shown in step 102.

This concludes the description of the preferred embodiment. Although three embodiments have been shown for practicing the invention, those skilled in the art will recognize many alterations and modifications without departing from the spirit and scope of the invention. Accordingly it is intended that the scope of the invention be limited only by the following claims.

What is claimed:

1. An apparatus for translating a signal into a two-state input signal for a microcomputer, comprising:
    summing means for adding electrical energy to said signal in response to a first feedback state of a feedback control signal to generate an intensified signal and for subtracting electrical energy from said signal in response to a second feedback state of said feedback control signal to generate a diminished signal, said signal is coupled to a first node and said summing means further comprises a first resistor and a second resistor coupled in series between said first node and a source of electrical power, a second node connected between said first resistor and said second resistor,
    controller means coupled to said summing means for recognizing a first input state of said signal when said diminished signal exceeds a predetermined value and for recognizing a second input state of said signal when said intensified signal falls below said predetermined value, said controller means comprising means for generating said feedback control signal having said first feedback state when said diminished signal exceeds said predetermined value and having said second feedback state when said intensified signal falls below said predetermined value, and said feedback control signal is connected to said second node.

2. An apparatus for translating a sensor signal into a two-state input signal for a microcomputer, comprising:
    conditioning means for providing a proportional signal related to the sensor signal and for adding electrical energy to said proportional signal in response to a first feedback state of a feedback control signal to intensify said proportional signal and for subtracting electrical energy from said proportional signal in response to a second feedback state of said feedback control signal to diminish said proportional signal;
    amplification means responsive to said conditioning means for providing an input signal having a first input state associated with an upper threshold amplitude of said sensor signal when said diminished signal exceeds a predetermined value and for providing a second input state associated with a lower threshold amplitude of said sensor signal when said intensified signal falls below said predetermined value; and
    microcomputer means responsive to said input signal for generating said feedback control signal having said first feedback state in response to said first input state of said input signal and having said second feedback state in response to said second input state of said input signal.

3. The apparatus recited in claim 2 wherein said amplification means comprises a single switching transistor.

4. The apparatus recited in claim 2 wherein said microcomputer provides said first feedback state at a high impedance and provides said second feedback state at substantially zero potential.

5. The apparatus recited in claim 2 wherein said first input state of said input signal is provided by said amplification means at a logic "0" state and said second input state of said input signal is provided by said amplification means at a logic "1" state.

6. An apparatus for translating a signal into a two-state input signal for a microcomputer, comprising:
    summing means for adding electrical energy to said signal in response to a first feedback state of a feedback control signal to generate an intensified signal and for subtracting electrical energy from said signal in response to a second feedback state of said feedback control signal to generate a diminished signal;
    switching means responsive to said summing means for providing a negative edge interrupt signal when said diminished signal exceeds a predetermined value and for providing a positive edge interrupt signal when said intensified signal falls below said predetermined value; and
    microcomputer means responsive to said switching means for generating said feedback control signal having said first feedback state in response to said negative edge interrupt signal and having said second feedback state in response to said positive edge interrupt signal.

7. The apparatus recited in claim 6 wherein said microcomputer recognizes said negative edge interrupt signal and disregards further changes in said interrupt signals until after generating said feedback control signal.

8. The apparatus recited in claim 6 wherein said microcomputer recognizes said positive edge interrupt signal and disregards further changes in said interrupt signals until after generating said feedback control signal.

9. An apparatus for translating a signal into a two-state input signal for a microcomputer, comprising:
- a switching transistor having a control electrode coupled to said signal through a first resistor, a first output electrode coupled to a source of electrical power, and a second output electrode coupled to a ground potential;
- a first resistor and a second resistor coupled in series between said source of electrical power and said control electrode; and
- microcomputer means responsive to said first output electrode and having a feedback output connected between said first and second resistors for providing substantially ground potential at said feedback output when said first output electrode is above a predetermined value and for providing a high impedance at said feedback output when said first output electrode is below a predetermined value.

10. The apparatus recited in claim 9, wherein said microcomputer further comprises a positive edge interrupt input and a negative edge interrupt input both connected to said first output electrode.

11. The apparatus recited in claim 10 wherein said microcomputer recognizes said input signal on a positive transition and disregards further changes in said input signal until after generating said feedback control signal.

12. The apparatus recited in claim 10 wherein said microcomputer recognizes said input signal on a negative transition and disregards further changes in said input signal until after generating said feedback control signal.

13. The apparatus recited in claim 9 wherein said switching transistor comprises an NPN transistor, said control electrode comprises a gate electrode, said first output electrode comprises a collector electrode and said second output electrode comprising an emitter electrode.

14. A method for translating a signal into a two-state input signal for a microcomputer, comprising the steps of:
- adding electrical energy to said signal in response to a first state of a feedback control signal to generate an intensified signal;
- subtracting electrical energy from said signal in response to a second state of said feedback control signal to generate a diminished signal;
- detecting a first input state of said signal when said diminished signal exceeds a predetermined value and generating said first state of said feedback control signal in response thereto; and
- detecting a second input state of said signal when said intensified signal falls below said predetermined value and generating said second state of said feedback control signal by a microcomputer in response thereto.

15. The method recited in claim 14 wherein said first feedback state comprises a logic "1".

16. The method recited in claim 14 wherein said first feedback state comprises a high impedance.

17. The method recited in claim 14 wherein said second feedback state comprises a logic "0".

18. A method for translating a sensor signal into a two-state input signal for a microcomputer, comprising the steps of:
- providing a proportional signal related to the sensor signal;
- adding electrical energy to said proportional signal in response to a first feedback state of a feedback control signal to intensify said proportional signal;
- subtracting electrical energy from said proportional signal in response to a second feedback state of said feedback control signal to diminish said proportional signal;
- providing an input signal having a first input state associated with an upper threshold amplitude of said sensor signal when said diminished signal exceeds a predetermined value;
- providing a second input state of said input signal associated with a lower threshold amplitude of said sensor signal when said intensified signal falls below said predetermined value; and
- generating said feedback control signal by a microcomputer providing said first feedback state in response to said first input state of said input signal and providing said second feedback state in response to said second input state of said input signal.

* * * * *